United States Patent
Sahouria et al.

(10) Patent No.: US 8,516,401 B2
(45) Date of Patent: Aug. 20, 2013

(54) MASK MODEL CALIBRATION TECHNOLOGIES INVOLVING ETCH EFFECT AND EXPOSURE EFFECT

(75) Inventors: Emile Sahouria, Sunnyvale, CA (US); Yuanfang Hu, San Jose, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 13 days.

(21) Appl. No.: 12/622,114

(22) Filed: Nov. 19, 2009

(65) Prior Publication Data
US 2010/0218161 A1    Aug. 26, 2010

Related U.S. Application Data

(60) Provisional application No. 61/116,203, filed on Nov. 19, 2008.

(51) Int. Cl.
*G06F 17/50* (2006.01)

(52) U.S. Cl.
USPC .............. 716/52; 716/54; 716/55; 716/136

(58) Field of Classification Search
USPC ....................................... 716/52, 54, 55, 136
See application file for complete search history.

(56) References Cited

U.S. PATENT DOCUMENTS

| | | | |
|---|---|---|---|
| 7,876,439 B2 * | 1/2011 | Ausschnitt et al. | 356/401 |
| 2007/0031745 A1 * | 2/2007 | Ye et al. | 430/30 |

* cited by examiner

*Primary Examiner* — Jack Chiang
*Assistant Examiner* — Mohammed Alam
(74) *Attorney, Agent, or Firm* — Plumsea Law Group, LLC

(57) ABSTRACT

Methods for jointly calibrating etch and exposure mask process models from etch only data are described. Initially, an etch model and an exposure model may be identified. Subsequently, a combined etch/exposure model may be generated based upon the etch model and the exposure model. Following which, a global optimization process may be performed to calibrate the combined etch/exposure model based upon measured data representing the etch and the exposure effects. With some implementations, the global optimization process is based in part upon a cost function representing the norm of the difference between the simulated mask contours and the measured mask contours. Furthermore, in some implementations, the optimization variable set is the union of the parameter sets corresponding to the etch model and the exposure model individually. Further still, with various implementations, the optimization of based upon the etch parameter set is "nested" inside an optimization of the exposure parameter set, or, vice versa.

14 Claims, 4 Drawing Sheets

MASK MODEL CALIBRATION TECHNOLOGIES INVOLVING ETCH EFFECT AND EXPOSURE EFFECT

RELATED APPLICATIONS

This application claims priority under 35 U.S.C. §119(e) to U.S. Provisional Patent Application No. 61/116,203 entitled "Joint Calibration In Mask Process Correction," filed on Nov. 19, 2008, and naming Emile Sahouria and Yuanfang Hu as inventors, which application is incorporated entirely herein by reference.

FIELD OF THE INVENTION

The invention relates to the field of integrated circuit design and manufacturing. More particularly, various implementations of the invention are applicable to jointly calibrating models useful to simulate optical lithographic masks.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, a design may typically start at a high level of abstraction, by a designer creating a specification that describes particular desired functionality. This specification, typically implemented by a programming language, such as, for example the C or C++ programming language, describes at a high level the desired behavior of the device. Designers will then often take this specification for the design and create a logical design, often implemented in a netlist, through a synthesis process. The logical design is often referred to as a "register transfer level" (RTL) description or register transfer level design.

A register transfer level design, often implemented by a hardware description language (HDL) such as Verilog, SystemVerilog, or Very High speed hardware description language (VHDL), describes the operation of the device by defining the flow of signals or the transfer of data between various hardware components within the design. More particularly, a register transfer level design describes the interconnection and exchange of signals between hardware registers and the logical operations that are performed on those signals.

The register transfer level design is again transformed, this time into a gate level design. Gate level designs describe the actual physical components such as transistors, capacitors, and resistors as well as the interconnections between these physical components. Often, gate level designs are also implemented by a netlist, such as, for example, a mapped netlist. Lastly, the gate-level design is taken and another transformation is carried out. First by place and route tools that arrange the components described by the gate-level netlist and route connections between the arranged components; and second, by layout tools that generate a layout description having layout "shapes" that may then used to fabricate the electronic device, through for example, an optical lithographic process.

Integrated circuit layout descriptions can be provided in many different formats. The Graphic Data System II (GDSII) format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in integrated circuit layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image embodied in the layout data is often referred to as the intended or target image or target contours, while the image created in the mask is generally referred to as the mask contours. Furthermore, the image created on the substrate by employing the mask in a photolithographic process is often referred to as the printed image or printed contours.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. A principal reason for declining yields is that as feature sizes shrink, the dominant cause of defects change. At larger process technologies, yield limitation is dominated by random defects. Despite the best clean room efforts, particles still find a way to land on chips or masks, causing shorts or opens. In smaller process technologies, for example the nanometer process technology, the dominant source of yield loss is pattern-dependent effects. These defects are a result of the design's features being smaller than the wavelength of light. As a result, the physical effects of light at these smaller feature sizes must be accounted for.

Various common techniques exist for mitigating these pattern dependant effects. For example, optical process correction (OPC), phase shift masks (PSM) or other resolution enhancement techniques (RET) are commonly employed to prepare a physical layout designs for manufacturing. Additionally, physical verification techniques that assist in accounting for issues such as planerization and antenna effects are also employed on physical layout designs. Although these extensive modifications to the physical layout design resulted in a layout design that was unrecognizable by the designer, the resulting manufactured circuit matched the designer's intent.

As explained above, resolution enhancement techniques optimize the mask or reticle in order to increase the fidelity of the optical lithographic process. During mask optimization processes, it is often necessary to simulate or model the mask contours. Accordingly, a model representing the mask contours based in part upon the target image is needed. Traditionally, mask models have been calibrated based upon single effects only, such as, for example, the etch effects, or the exposure effects.

SUMMARY OF THE INVENTION

Various implementations of the present invention provide methods and apparatuses for calibrating a mask process model jointly based upon the etch effects and the exposure effects. In various implementations, an etch model and an exposure model are identified. Subsequently, a combined etch/exposure model is generated based upon the etch model and the exposure model. Following which, a global optimization process is performed to calibrate the combined etch/exposure model based upon measured data representing the etch and the exposure effects.

With some implementations, the global optimization process is based in part upon a cost function representing the norm of the difference between the simulated mask contours and the measured mask contours. Furthermore, in some implementations, the optimization variable set is the union of the parameter sets corresponding to the etch model and the exposure model individually. Further still, with various implementations, the optimization of based upon the etch parameter set is "nested" inside an optimization of the exposure parameter set, or, vice versa.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE IMPLEMENTATIONS

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

Furthermore, in various implementations of the invention, a mathematical model may be employed to represent an electronic device. With some implementations, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, results in a different device design. More particularly, manipulation of the model results in a transformation of the corresponding physical design and any physical device rendered or manufactured by the device design. Additionally, those of skill in the art can appreciate that during many electronic design and verification processes, the response of a devices design to various signals or inputs is simulated. This simulated response corresponds to the actual physical response the device being modeled would have to these various signals or inputs.

Some of the methods described herein can be implemented by software stored on a computer readable storage medium, or executed on a computer. Accordingly, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
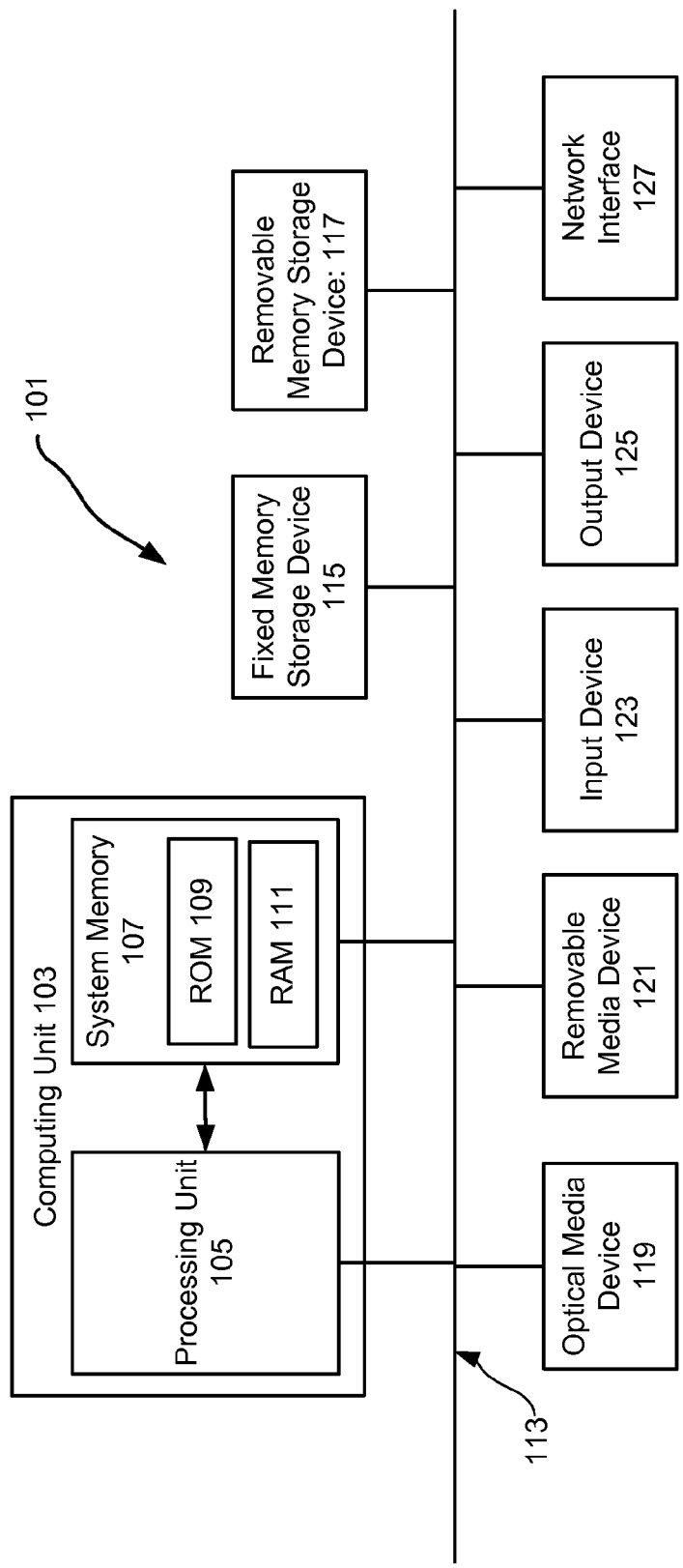
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM)

109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Layout Design And Mask

In a photolithographic process, as explained above, electromagnetic radiation is transmitted through selectively transparent areas of a mask. The radiation passing through these transparent areas then irradiates desired portions of a photoresistive material on a layer of semiconductor substrate. The mask in turn is created from layout design data describing the geometric features that should be manufactured on the semiconductor substrate, by way of the photolithographic process, in order to create the desired circuit. For example, if a transistor should have a rectangular gate region, then the layout design data will include a rectangle defining that gate region. This rectangle in the layout design data is then implemented in a mask for "printing" the rectangular gate region onto the substrate.

Figure 2:
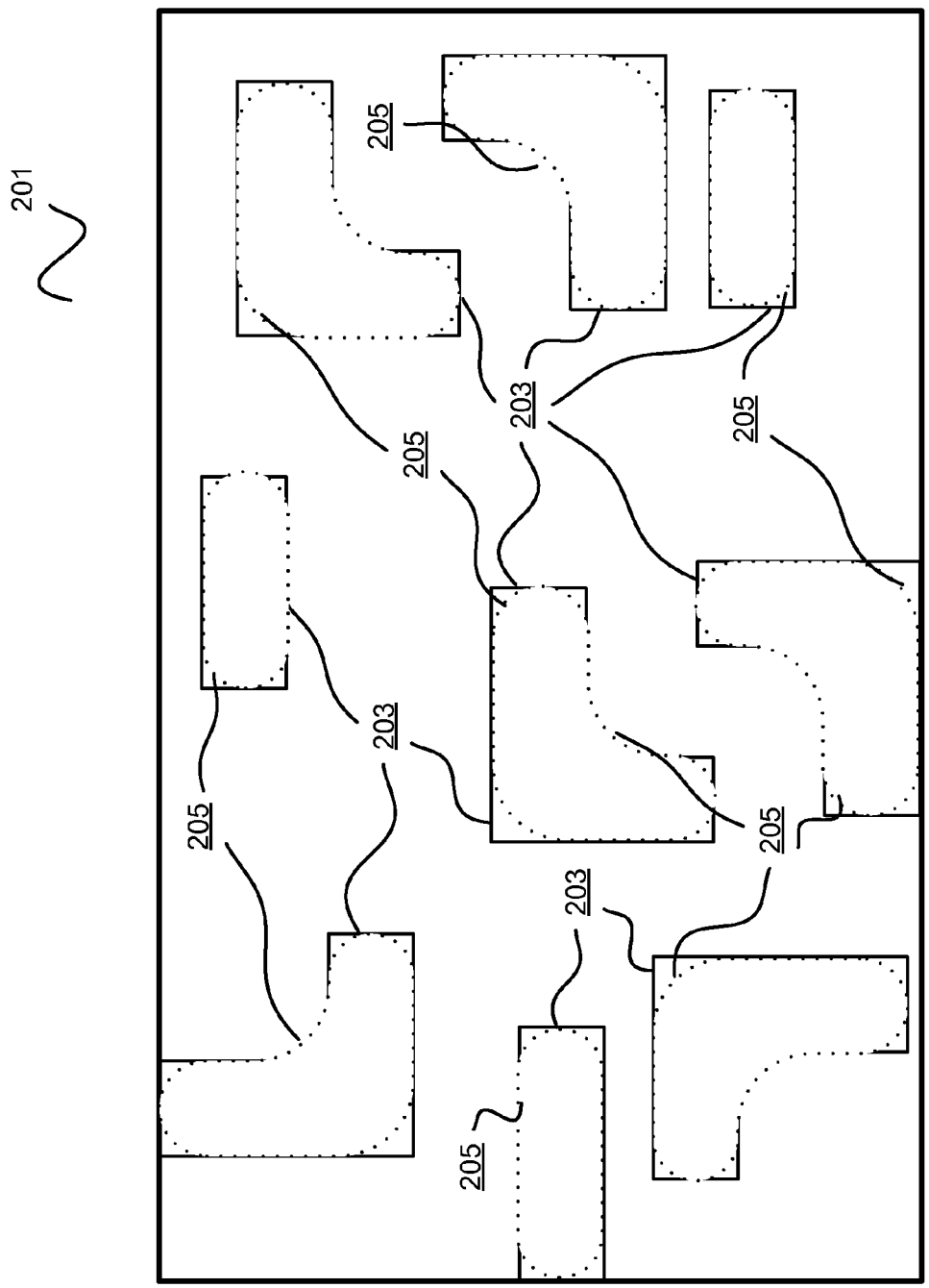
FIG. 2 illustrates a layout design and corresponding printed shapes.

For example, FIG. 2 illustrates a layout design 201 having shapes 203 defined therein. As described above, radiation passes though transparent areas of a mask, such as for example the areas defined by the shapes 203, causing the shapes formed by the transparent areas to be formed on a substrate. As the features embodied in the mask are printed however, optical effects, such as diffractive effects, will prevent certain shapes or combinations of shapes defined by the mask from being faithfully imaged onto the substrate. For example, during an optical lithographic process, the shapes 205 as opposed to the shapes 203 may be realized on the substrate. As the mask shapes become smaller relative to the wavelength of radiation used in the optical lithographic process, these distortions become more pronounced.

As stated previously, the mask is manufactured based upon the layout design, or target contours. Typically, selected areas of a transparent material are exposed to radiation, such as, for example by a laser beam or electron beam (e-beam) writer. Subsequently, an etching process is used to coat selected areas of the transparent material with a radiation absorbing material, such as, for example chromium. Accordingly, the mask contours, are highly dependant upon both the etch and the exposure processes involved in manufacturing the mask.

During various stages of device development, such as, for example optical proximity correction or mask process correction, it is desirable to simulate the mask contours. However, as stated above, etch models and exposure models are traditionally calibrated individually. However, as measurement data with which to calibrate mask models is typically only available for the chromium etch patterns, there is a need to jointly calibrate the etch and the exposure mask process models based upon the etch measurements.

Joint Mask Process Model Calibration

Figure 3:
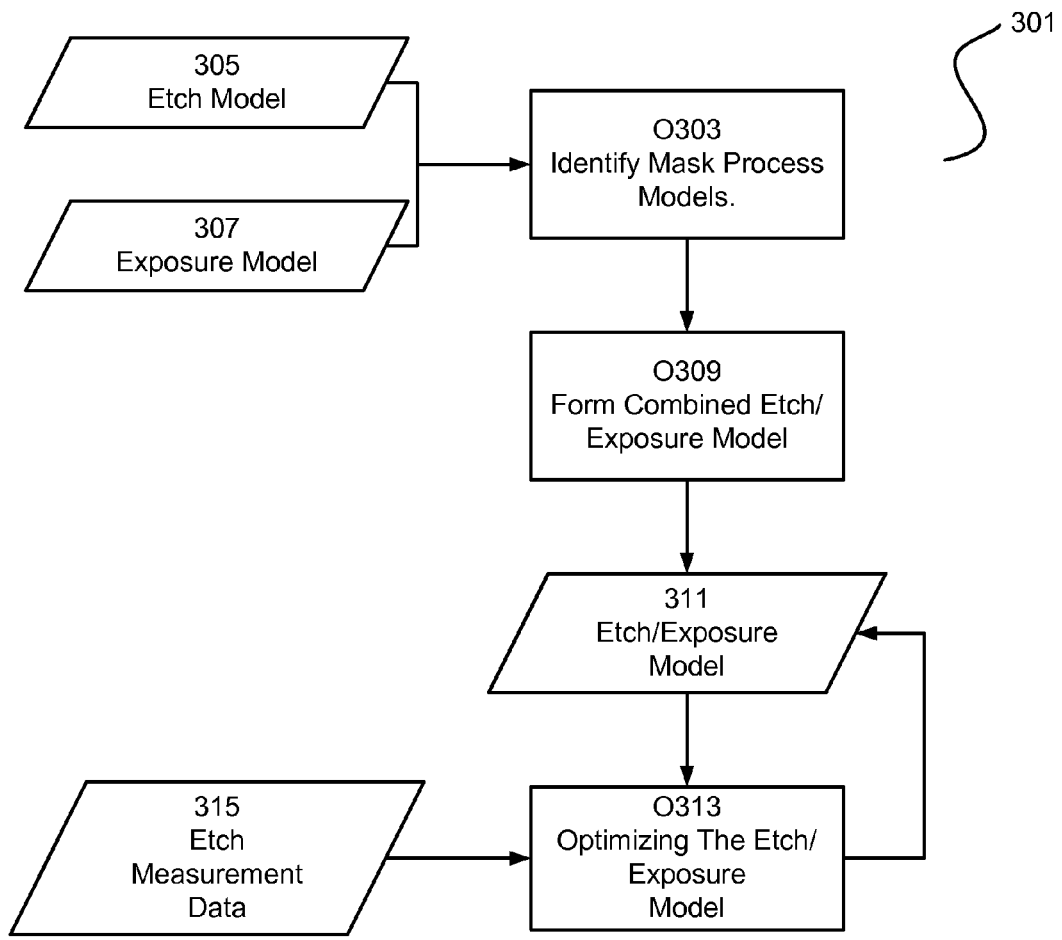
FIG. 3 illustrates a method of jointly calibrating a mask process model.

FIG. 3 illustrates a method 301 for jointly calibrating a mask process model that may be provided by various implementations of the present invention. As can be seen from this figure, the method 301 includes an operation 303 for identifying mask process models. In various implementations, the operation 303 identifies an etch model 305 and an exposure model 307. Subsequently, as illustrated, the method 301 includes an operation 309 for forming a combined etch/exposure model 311. Various etch and exposure models are known to those of skill in the art. For example, U.S. Provisional Patent Application No. 61/117,286, entitled "Electron Beam Simulator," filed Nov. 24, 2008, and naming Yuri Granik as inventor, *Correction For Etch Proximity: New Models And Applications*, by Yuri Granik, Proceedings of SPIE Vol. 4346 (2001), which application and article are incorporated entirely herein by reference, discuss various etch and exposure models.

The method 301 additionally includes an operation 313 for optimizing the combined etch/exposure model 311. In various implementations, the operation 313 performs a global minimization based upon etch measurement data 315. With some implementations of the invention, the etch measurement data 315 includes target shapes and corresponding mask shapes. Still, with some implementations, the etch measurement data 315 includes a measure of the difference between the target shapes and the mask shapes. More particularly, the etch measurement data 315 may include a measure of the difference between the shapes intended to be created in the mask, and the actual shapes realized by the etched chromium. Further still, in various implementations, the measurements may be taken at points along the edge of the shapes. In some implementations, these points will be arbitrarily chosen. With various implementations of the present invention, physical effects not related to the etch and exposure process may be removed from the etch measurement data 315. For example, measurements attributed to long range physical effects may be removed.

Figures 4, 5:
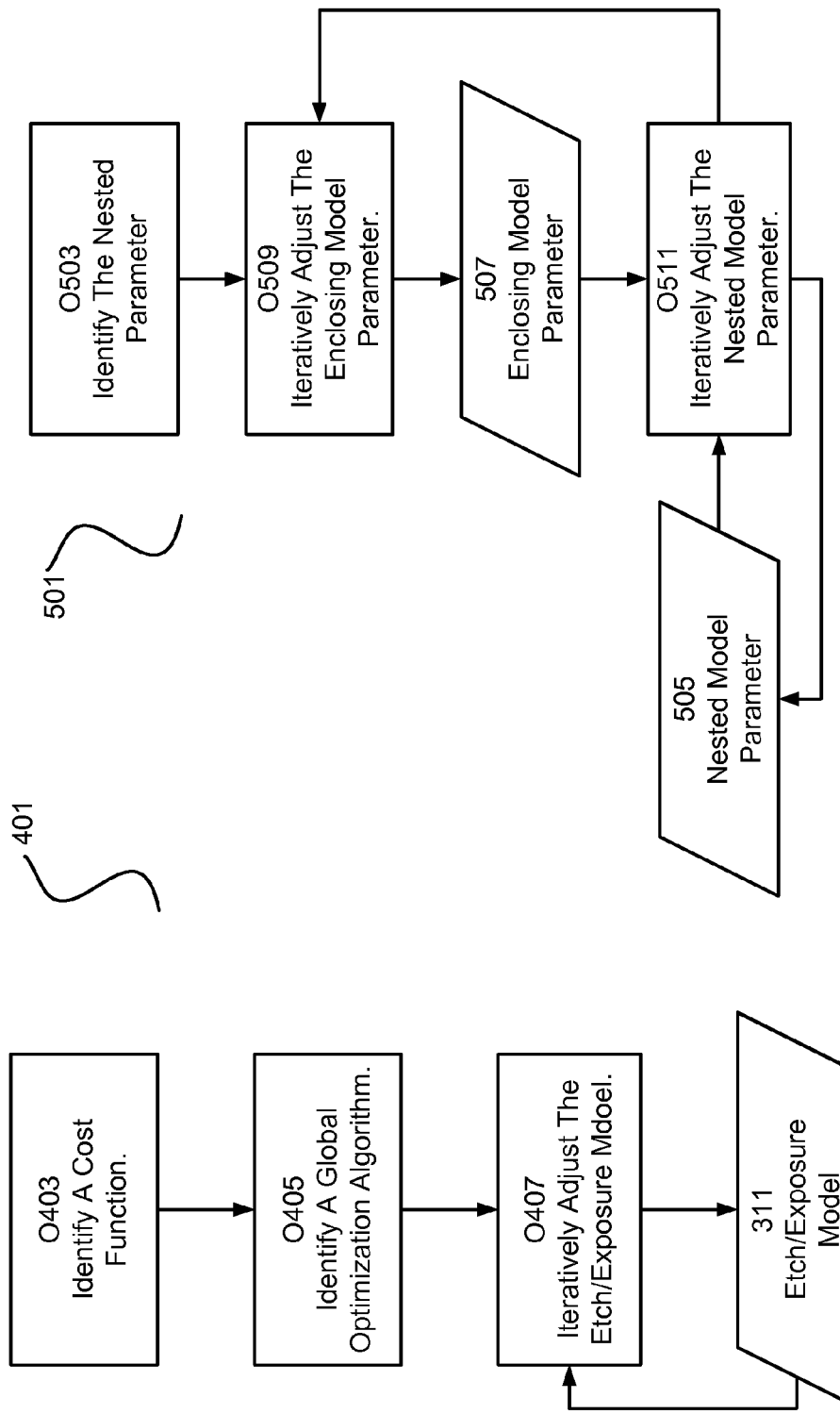
FIG. 4 illustrates a method of optimizing a mask process model.
FIG. 5 illustrates a method of optimizing a mask process model.

As stated, the operation 313 optimizes the etch/exposure model 311. FIG. 4 illustrates a method of optimizing a combined etch/exposure model, such as, for example, the etch/exposure model 311. As can be seen from this figure, the method 401 includes an operation 403 for identifying a cost function, an operation 405 for identifying a global optimization algorithm, and an operation 407 for iteratively adjusting the etch exposure model 311 based upon the cost function and the global optimization algorithm. In various implementations of the invention, the etch/exposure model 311 is a function that relates a set of target shapes or a set of target contours to a set of mask shapes or a set of mask contours (often referred to as simulated contours), based in part upon one or more combined etch/exposure parameters. With alternative implementations, the etch/exposure model 311 is a function that relates a set of target shapes or a set of target contours to a set of mask shapes or a set of mask contours (also frequently referred to as the simulated contours), based in part upon one or more etch parameters and one or more exposure parameters. Accordingly, with some implementations, the cost function identified is a weighted norm of the difference between the simulated contours and the measurement data.

Various global optimization algorithms, such as, for example global minimization, are known to those of skill in the art. *Global optimization of masks, including film stack design to restore TM contrast in high NA TCC's*, by Alan Rosenbluth et al., Proceedings of SPIE Vol. 6520 (2007), which article is incorporated entirely herein by reference, discusses global optimization in the context of mask design and creation. In various implementations of the invention, the operation 405 identifies a global minimization algorithm, such as, for example the algorithm discussed above.

Subsequently, the operation 407 proceeds to carry out the identified optimization algorithm, by iteratively adjusting the etch/exposure model based upon the identified global optimization algorithm and the cost function. In various implementations of the present invention, the operation 407 causes the etch/exposure parameter to be adjusted, iteratively, such that the cost function is minimized With alternative implementations of the invention, a "nested" adjustment process is employed. FIG. 5 illustrates a nested adjustment process, which may be implemented in various application of the invention. As can be seen form this figure, the Method 501 includes an operation 503 for identifying a nested model parameter 505. In various implementations of the invention, the nested model parameter 505 is the one or more etch parameters. With alternative implementations, the nested model parameter 505 is the one or more exposure model parameters. The non-nested parameter is herein referred to as the enclosing parameter 507. With various implementations, the nested model parameter 505 corresponds to the simulation that is the least costly. More particularly, if etch simulation is more time consuming that exposure simulation, the one or more exposure parameters may be identified as the nested model parameter 505. The method 501 further includes an operation 509 for iteratively adjusting the enclosing model parameter 507, and an operation 511 for iteratively adjusting the nested model parameter 505. As illustrated, for each iteration of the operation 509, the nested model parameter is fully optimized, that is to say, the nested model parameter 505 is iteratively adjusted based upon the cost function and the global optimization algorithm.

CONCLUSION

As described above, various implementations of the invention provide for the joint calibration of mask process models.

In various implementations, an etch model and an exposure model are identified. Subsequently, a combined etch/exposure model is generated based upon the etch model and the exposure model. Following which, a global optimization process is performed to calibrate the combined etch/exposure model based upon measured data representing the etch and the exposure effects.

As further described, with some implementations, the global optimization process is based in part upon a cost function representing the norm of the difference between the simulated mask contours and the measured mask contours. Furthermore, in some implementations, the optimization variable set is the union of the parameter sets corresponding to the etch model and the exposure model individually. Further still, with various implementations, the optimization of based upon the etch parameter set is "nested" inside an optimization of the exposure parameter set, or, vice versa.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method for calibrating a mask process model comprising:
    identifying a mask etch model;
    identifying a mask exposure model;
    forming a mask process model from the mask etch model and the mask exposure model;
    identifying a set of measured data; and
    optimizing on a computer the mask process model based in part upon the set of measured data to jointly calibrate the mask etch model and the mask exposure model.

2. The computer-implemented method recited in claim 1, further comprising saving the optimized mask process model onto one or more tangible memory storage media.

3. The computer-implemented method recited in claim 1, the method act of identifying the set of measured data comprising:
    identifying a layout having one or more target shapes;
    identifying a mask manufactured based in part upon the layout, the mask having one or more mask shapes that correspond to the one or more target shapes; and
    measuring a difference between the one or more target shapes and the one or more mask shapes at a plurality of locations within the mask.

4. The computer-implemented method recited in claim 1;
    wherein the mask process model includes one or more combined etch/exposure parameters; and
    wherein the method act of optimizing on the computer the mask process model comprises:
    identifying a cost function; and
    iteratively adjusting the one or more combined etch/exposure parameters such that the cost function is minimized.

5. The computer-implemented method recited in claim 4;
    wherein the mask process model relates a target contour to a simulated etch/exposure contour based in part upon the one or more combined etch/exposure parameters; and
    wherein the cost function is the norm of the difference between the simulated etch/exposure contour and the measured data.

6. The computer-implemented method recited in claim 1;
    wherein the mask process model includes one or more mask etch parameters and one or more mask exposure parameters; and wherein the method act of optimizing on the computer the mask process model comprises:
identifying a cost function;
iteratively adjusting the one or more mask etch parameters such that the cost function is minimized; and
during each iteration of adjusting the one or more mask etch parameters, iteratively adjusting the one or more mask exposure parameters such that the cost function is minimized.

7. The computer-implemented method recited in claim 1;
wherein the mask process model includes one or more mask etch parameters and one or more mask exposure parameters; and
wherein the method act of optimizing on the computer the mask process model comprises:
identifying a cost function;
iteratively adjusting the one or more mask exposure parameters such that the cost function is minimized; and
during each iteration of adjusting the one or more mask exposure parameters, iteratively adjusting the one or more mask etch parameters such that the cost function is minimized.

8. One or more computer-readable devices, having computer executable instructions for calibrating a mask process model stored thereon, the computer executable instructions comprise:
causing a computer to perform a set of operations; and
wherein the set of operations include:
identifying a mask etch model;
identifying a mask exposure model;
forming a mask process model from the mask etch model and the mask exposure model;
identifying a set of measured data; and
optimizing on the computer the mask process model based in part upon the set of measured data to jointly calibrate the mask etch model and the mask exposure model.

9. The one or more computer-readable devices recited in claim 8, the set of operations further comprising saving the optimized mask process model onto one or more tangible memory storage media.

10. The one or more computer-readable devices recited in claim 8, the operation for identifying the set of measured data comprising:
identifying a layout having one or more target shapes;
identifying a mask manufactured based in part upon the layout, the mask having one or more mask shapes that correspond to the one or more target shapes; and
measuring a difference between the one or more target shapes and the one or more mask shapes at a plurality of locations within the mask.

11. The one or more computer-readable devices recited in claim 8;
wherein the mask process model includes one or more combined etch/exposure parameters; and
wherein the operation for optimizing on the computer the mask process model comprises:
identifying a cost function; and
iteratively adjusting the one or more combined etch/exposure parameters such that the cost function is minimized.

12. The one or more computer-readable devices recited in claim 11;
wherein the mask process model relates a target contour to a simulated etch/exposure contour based in part upon the one or more combined etch/exposure parameters; and
wherein the cost function is the norm of the difference between the simulated etch/exposure contour and the measured data.

13. The one or more computer-readable devices recited in claim 8;
wherein the mask process model includes one or more mask etch parameters and one or more mask exposure parameters; and
wherein the operation for optimizing on the computer the mask process model comprises:
identifying a cost function;
iteratively adjusting the one or more mask etch parameters such that the cost function is minimized; and
during each iteration of adjusting the one or more mask etch parameters, iteratively adjusting the one or more mask exposure parameters such that the cost function is minimized.

14. The one or more computer-readable devices recited in claim 8;
wherein the mask process model includes one or more mask etch parameters and one or more mask exposure parameters; and
wherein the operation for optimizing on the computer the mask process model comprises:
identifying a cost function;
iteratively adjusting the one or more mask exposure parameters such that the cost function is minimized; and
during each iteration of adjusting the one or more mask exposure parameters, iteratively adjusting the one or more mask etch parameters such that the cost function is minimized.

* * * * *